United States Patent [19]

Ovens

[11] Patent Number: 5,015,888
[45] Date of Patent: May 14, 1991

[54] CIRCUIT AND METHOD OF GENERATING LOGIC OUTPUT SIGNALS FROM AN ECL GATE TO DRIVE A NON-ECL GATE

[75] Inventor: Kevin M. Ovens, Garland, Tex.

[73] Assignee: Texas Instruments Incorporated, Dallas, Tex.

[21] Appl. No.: 423,925

[22] Filed: Oct. 19, 1989

[51] Int. Cl.⁵ .............................. H03K 19/01
[52] U.S. Cl. ................. 307/475; 307/296.6; 307/310
[58] Field of Search ............... 307/443, 455, 456, 475, 307/296.6, 310; 323/907

[56] References Cited

U.S. PATENT DOCUMENTS

| | | | |
|---|---|---|---|
| 4,620,115 | 10/1986 | Lee et al. | 307/475 X |
| 4,629,913 | 12/1986 | Lechner | 307/455 X |
| 4,644,194 | 2/1987 | Birrittella et al. | 307/475 |
| 4,749,883 | 6/1988 | Price, Jr. | 307/475 X |
| 4,857,776 | 8/1989 | Khan | 307/443 X |
| 4,920,284 | 4/1990 | Denda | 307/475 |
| 4,931,673 | 6/1990 | Naghshineh | 307/475 |

Primary Examiner—David Hudspeth
Attorney, Agent, or Firm—James T. Comfort; Melvin Sharp; B. Peter Barndt

[57] ABSTRACT

Conversion from a first set of logic levels, such as ECL levels, to a second set of logic levels, such as TTL, is performed by using a regulator (46) and is parallel to the circuit generating the first set of logic levels.

26 Claims, 2 Drawing Sheets

CIRCUIT AND METHOD OF GENERATING LOGIC OUTPUT SIGNALS FROM AN ECL GATE TO DRIVE A NON-ECL GATE

TECHNICAL FIELD OF THE INVENTION

This invention relates in general to integrated circuits, and more particularly to a method and apparatus for converting ECL logic levels to TTL logic levels.

BACKGROUND OF THE INVENTION

In many integrated circuit designs, it is desirable to combine several different transistor technologies, such as ECL (emitter-coupled logic), TTL (transistor- transistor logic), and MOS (metal-on-silicon). In order to combine ECL and TTL technologies, the outputs of the ECL gates must be translated to a logic level suitable for TTL gates. Typically, an ECL gate will use a voltage of $-1.6$ volts to represent a low logic level (a "0") and will use a voltage of $-0.8$ volts to represent a high logic level (a "1"). On the other hand, TTL uses a voltage less than 0.4 volts to represent a low logic level and a voltage of greater than 2.7 volts to represent a high logic level. It is important for speed and noise margin considerations that the "trip point" of the TTL, i.e., the voltage at which TTL distinguishes between high and low logic levels, be centered with the transition between high and low ECL logic levels.

In the prior art, ECL-to-TTL level shifters are used between ECL and TTL gates to shift the voltages output from associated ECL circuits. The ECL-to-TTL level shifters add a delay of approximately one nanosecond to the circuit. Since speed is a primary advantage of ECL devices, the slowness of the voltage level shifter is a serious problem. Furthermore, the ECL-to-TTL level shifters increase the power consumed by the integrated circuit.

Therefore, a need has arisen in the industry to provide a method and circuit for converting ECL outputs to TTL logic levels which reduces or eliminates the delay associated with the conversion.

SUMMARY OF THE INVENTION

In accordance with the present invention, an ECL gate is provided which substantially eliminates or prevents the disadvantages and problems associated with prior ECL devices.

The ECL gate of the present invention is operable to receive ECL logic inputs and output logic levels for a non-ECL gate, such as TTL. The ECL gate is coupled with a voltage regulator such that a voltage transition at the output of the ECL gate encompasses the threshold voltage of the non-ECL gate.

The present invention provides several technical advantages over the prior art. First, since the outputs of the ECL gate drive the non-ECL gate directly, there is no delay associated with the translation of logic signals. Second, since the level translation may be performed on one phase of the ECL gate, the other phase may be used for other purposes such as feedback. Third, the power associated with the logic level translation is less than prior art systems.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1-4 of the drawings, like numerals being used for like and corresponding parts of the various drawings.

Figure 1:
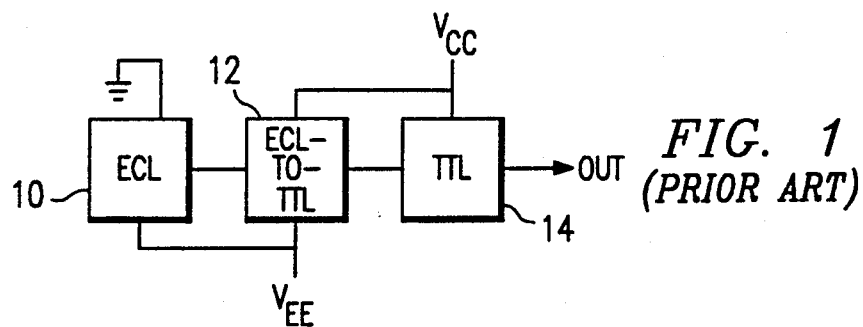
FIG. 1 illustrates a block diagram of a prior art ECL-to-TTL conversion technique.

FIG. 1 illustrates a block diagram illustrating a prior art ECL-to-TTL conversion technique. In the prior art, the ECL gate 10 outputs logic signals at the typical voltages, i.e., $-1.6$ volts representing a logic low state and $-0.7$ to $-0.8$ volts representing a logic high level. The output from the ECL gate 10 is received by an ECL-to-TTL converter 12 which shifts the voltage levels of the ECL output signals to TTL logic levels. Typical TTL logic levels are 0.4 volts representing a low logic and 2.6 volts representing a high logic. The ECL-to-TTL converter 12 outputs the level shifted output signals to the TTL gate 14.

Figure 2:
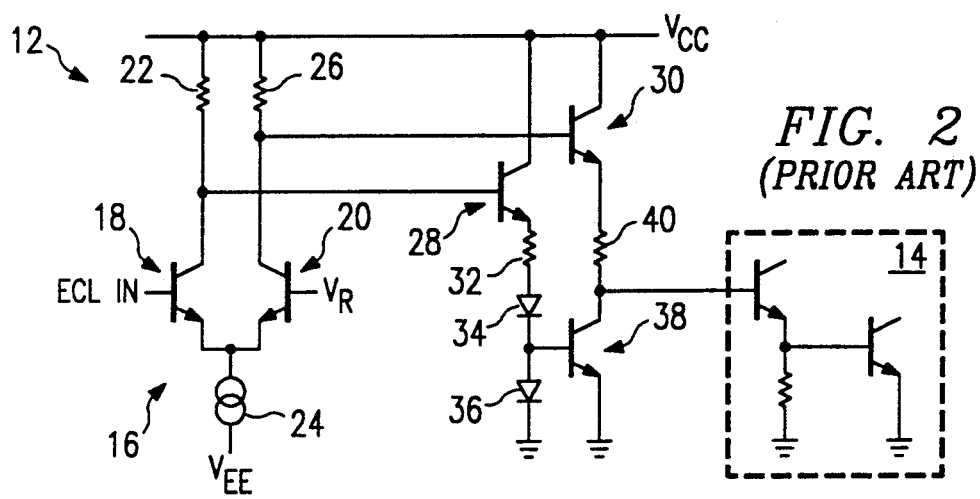
FIG. 2 illustrates a schematic representation of a prior art implementation of ECL-to-TTL converter circuit.

FIG. 2 illustrates a schematic representation of the ECL-to-TTL converter 12 shown in FIG. 1. The ECL-to-TTL converter 12 comprises a differential transistor pair 16 including two NPN transistors 18 and 20. NPN transistor 18 has a base connected to the ECL input signal (ECL IN), a collector connected to $V_{cc}$ via a resistor 22, and an emitter connected to $V_{ee}$ through a current source 24. The NPN transistor 20 has a base connected to a reference voltage ($V_R$), a collector connected to $V_{cc}$ through a resistor 26, and an emitter connected to $V_{ee}$ through the current source 24. The collector of the NPN transistor 18 is also connected to the base of an NPN transistor 28 and the collector of NPN transistor 20 is connected to the base of an NPN transistor 30. The collectors of the NPN transistors 28 and 30 are connected to $V_{cc}$. The emitter of the NPN transistor 28 is connected to ground via a resistor 32 and diodes 34 and 36. An NPN transistor 38 has a base connected between diodes 34 and 36, an emitter connected to ground and a collector connected to the emitter of NPN transistor 30 through a resistor 40. The node between the collector of NPN transistor 38 and resistor 40 is connected to the TTL gate 14 which is shown as including two $V_{be}$ voltage drops.

The prior art circuit shown in FIGS. 1 and 2 has several disadvantages. First, the ECL-to-TTL circuit 12 adds a delay between the ECL gate 10 and the TTL gate 14 of at least one nanosecond. In a fast circuit, this may represent a delay of approximately 25% of the normal delay through the entire circuit. Further, the ECL-to-TTL circuit uses approximately 1-2 ma of current, thereby increasing the power requirements of the integrated circuit.

Figure 3:
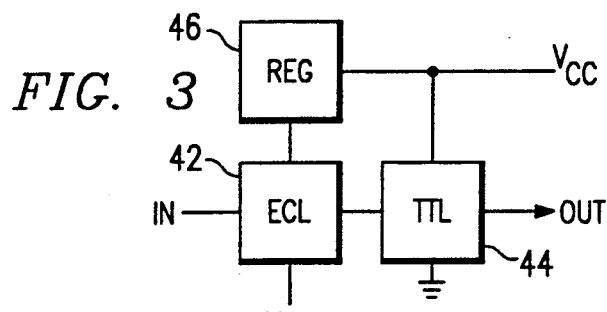
FIG. 3 illustrates a block diagram of the ECL-to-TTL conversion technique of the present invention.

FIG. 3 illustrates a block diagram of the ECL-to-TTL converter of the present invention. The ECL gate 42 has outputs directly connected to the TTL gate 44. A regulator 46 is connected to the ECL gate 42.

In operation, the gate 42 drives the TTL gate directly, so that there is no delay in level shifting the ECL outputs the regulator 46 generates the proper output voltages at the ECL output.

Figure 4:
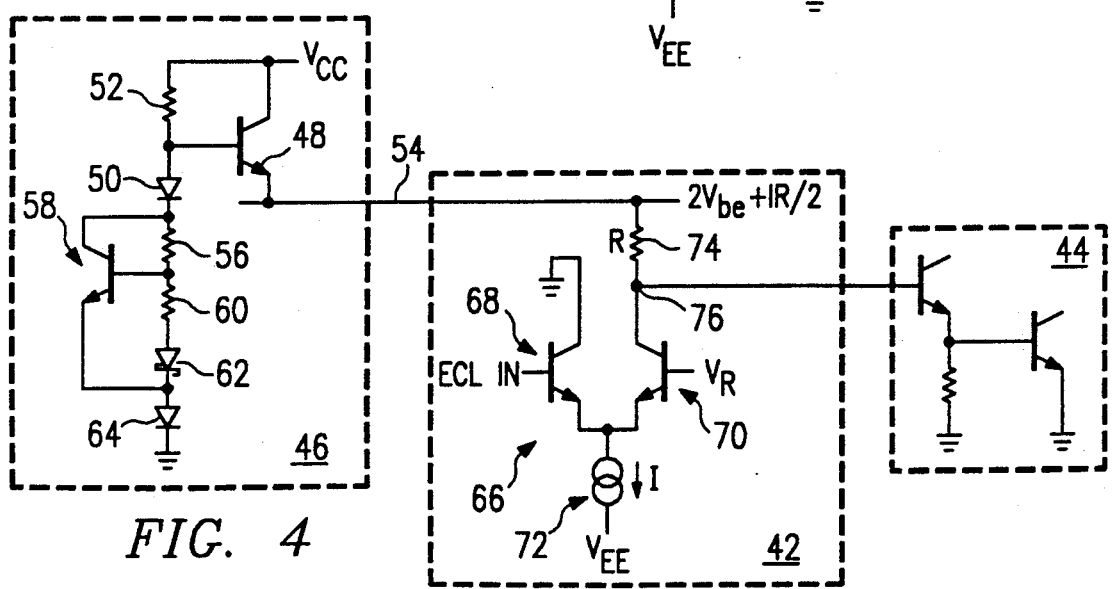
FIG. 4 illustrates a schematic representation of the preferred embodiment of the present invention.

FIG. 4 illustrates the preferred embodiment of the present invention. The regulator 46 comprises an NPN transistor 48 having a base connected to the anode of a diode 50 and of a resistor 52, a collector connected to $V_{cc}$ and an emitter connected to a voltage node 54. The other end of the resistor 52 is also connected to $V_{cc}$. The cathode of the diode 50 is connected to one end of a resistor 56 and the collector of an NPN transistor 58. The other end of resistor 56 is connected to the base of NPN transistor 58 and to a first end of a resistor 60. The other end of resistor 60 is connected to the anode of diode 62, the cathode of which is connected to the emitter of NPN transistor 58 and the anode of a diode 64. The cathode of diode 64 is connected to ground.

The voltage node 54 is connected to the ECL gate 42. The ECL gate 42 comprises a differential transistor pair 66 including an NPN transistor 68 and a NPN transistor 70. The base of NPN transistor 68 is connected to the input of the ECL gate 42 (ECL IN), the collector of transistor 68 is connected to ground and the emitter of transistor 68 is connected to a current source 72. The NPN transistor 70 has a base connected to the ECL reference voltage, an emitter connected to the current source 72 and a collector connected to the voltage node 54 through resistor 74 having a resistive value of R. The input to the TTL gate 44 is connected to an input node 76 connected to the collector of transistor 70. The TTL gate 44 receives its input directly from the collector of NPN transistor 70.

In operation, the voltage on node 54 is set at the threshold of the driven gate plus half the swing of the driving gate. In this case, the threshold of the driven gate is two NPN transistor base-emitter voltages (2 $V_{be}$'s), and the swing of the driving gate is 0.8 volts (I*R) to get proper tracking over temperature and manufacturing variations, the regulator 46 sets the node 54 voltage to (2 $V_{be}$'s+(.8/2)) volts or 2 $V_{be}$+IR/2 volts.

When ECL IN is greater than $V_R$, the current through the current source 72 will be drawn through transistor 68, and transistor 70 will conduct no current through resistor 74. Since the voltage on node 54 is greater than the threshold of the TTL gate 44, resistor 74 will conduct into TTL gate 44 turning it on. When ECL IN is less than $V_R$, the current through the current source 72 will be drawn through transistor 70 causing an IR volt drop across resistor 74. This causes the voltage on node 76 to fall below the threshold of TTL gate 44 turning it off.

In the illustrated embodiment, the diode 62 and transistor 58 are sized such that the voltage drop across resistor 60 will remain relatively constant with temperature. Resistor 56 is sized such that the voltage across it will be IR/2. Diode 64 and the base-emitter junction of transistor 48. Hence, the voltage on node 54 will equal 2 $V_{be}$+IR/2 over a wide temperature range.

It should be noted that the voltage on node 54 can be set at any level, such that the voltage at input node 76 swings around the threshold voltage of the TTL (or other technology) gate 44. For example, the voltage on node 54 could be set to swing about the threshold voltage of a CMOS gate.

Figure 5:
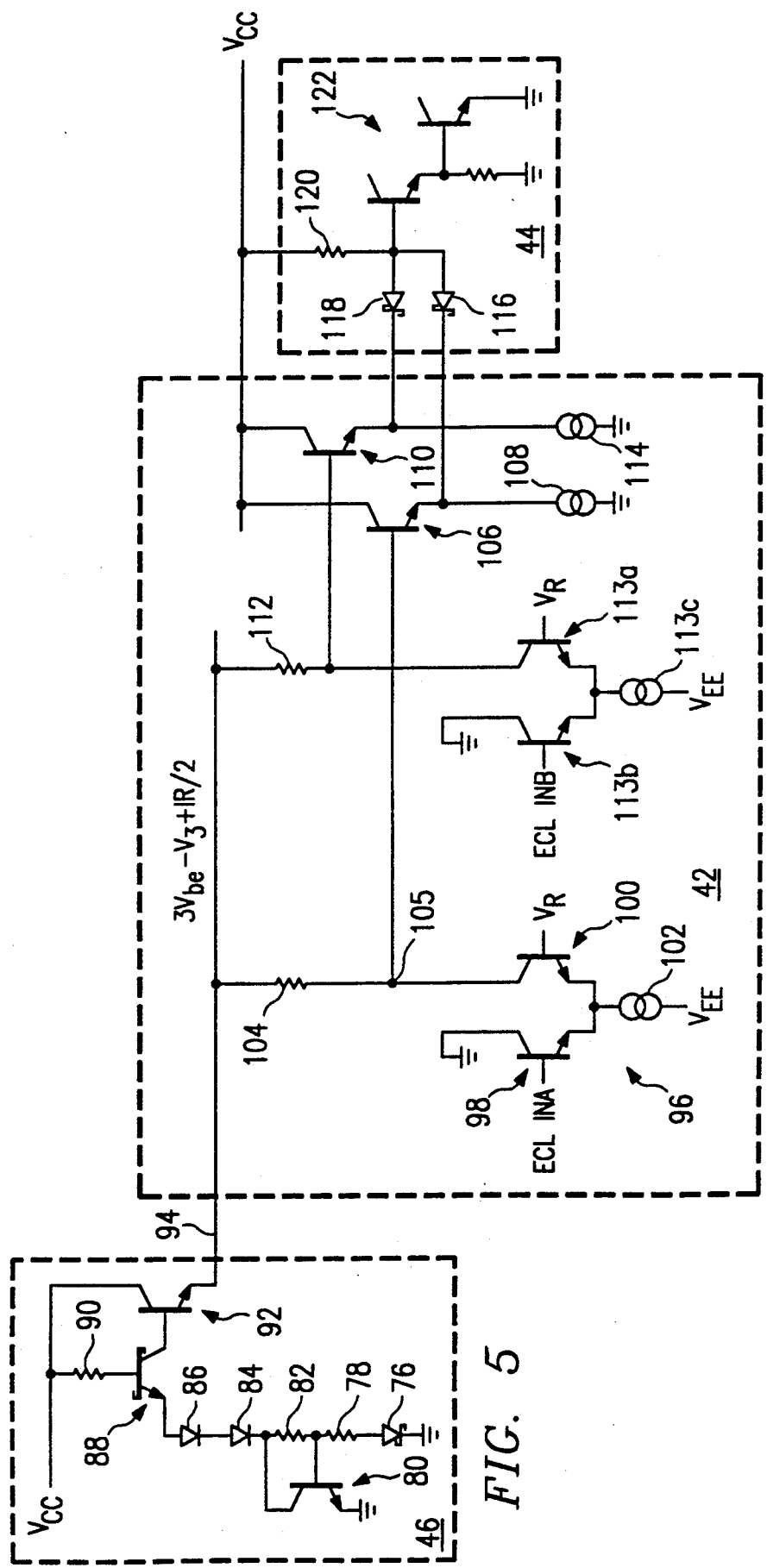
FIG. 5 illustrates a schematic representation of a second embodiment of the present invention.

FIG. 5 illustrates an embodiment of the present invention using isolation between the ECL and TTL gates. In this embodiment, the regulator 46 comprises a diode 76 having its cathode connected to ground and its anode connected to a resistor 78. The other end of the resistor 78 is connected to the base of an NPN transistor 80 having an emitter connected to ground. A resistor 82 is connected between the base and collector of the transistor 80. Diode 84 has its cathode connected to the collector transistor 80 and its anode connected to the cathode of a diode 86. The anode of diode 86 is connected to the emitter of an NPN Schottky transistor 88. The base of transistor 88 is connected to $V_{cc}$ through a resistor 90. The collector of transistor 88 is connected to the base of an NPN transistor 92. The collector of NPN transistor 92 is connected to $V_{cc}$ and the emitter of transistor 92 is connected to a voltage node 94. A differential pair 96 comprises NPN transistors 98 and 100. The emitters of transistors 98 and 100 are connected to a current source 102. The collector of transistor 98 is connected to ground and the base of transistor 98 is connected to a first ECL input (ECL IN A). The collector of transistor 100 is connected to the voltage node 94 through resistor 104. An input node 105 is defined where the resistor 104 connects with the collector of transistor 100. The collector of transistor 100 is also connected to a NPN transistor 106 having a collector connected to $V_{cc}$ and the emitter connected to a current source 108. A NPN transistor 110 is connected to node 94 through resistor 112. The base of transistor 110 is also connected to the collector of transistor 113a which forms a differential pair with transistor 113b. The base of transistor 113a is connected to $V_R$ and the emitter of transistor 113a is connected to current source 113c. Transistor 113b has a base connected to a second ECL input (ECL IN B), a collector connected to ground and an emitter connected to current source 113c. The collector of transistor 110 is connected to $V_{cc}$ and the emitter is connected to current source 114. The emitters of transistors 106 and 110 are connected to the cathode of diodes 116 and 118, respectively. The anodes of the diodes 116 and 118 are connected to $V_{cc}$ through resistor 120. The base of the TTL gate, denoted generally by reference numeral 122, is connected to the anodes of the two diodes.

FIG. 5 illustrates a situation where one or more of the collectors from the ECL gate 42 are used to perform a logic function, in this case a two-input NAND gate. Diodes 116 and 118 are used to decouple the TTL gate 44 from the ECL gate 42 which may be using one or both of its collector for feedback for additional logic.

In the illustrated embodiment, the voltage node 94 is set to a voltage of 3 $V_{be}-V_s+IR/2$ where $V_s$ represents the forward voltage of a Schottky diode, such as diodes 116 and 118. The additional $V_{be}$ is due to the emitter follower 106 which increases the voltage threshold of the TTL gate 44 relative to the input node 105.

The present invention provides several technical advantages over the prior art. Importantly, the present invention allows an ECL gate to be directly coupled to a TTL gate, thereby avoiding any delays due to voltage level shifting. Furthermore, the output of regulator 46 is in series with the ECL gate 42, and therefore, does not add significantly to the power consumption. Third, the present invention uses only one phase from the ECL logic, freeing the other phase for feedback and additional logic.

Although the present invention has been described in detail, it should be understood that various changes, substitutions and alterations can be made herein without departing from the spirit and scope of the invention as defined by the appended claims.

What is claimed is:

1. A circuit for generating logic output signals from an ECL gate for driving the input of a non-ECL gate comprising:
   a node associated with the output of the ECL gate and the input to the non-ECL gate; and
   voltage regulator circuitry for regulating the voltage on said node such that a voltage transition at said node responsive to a transition of the ECL gate encompasses the threshold voltage of the non-ECL gate to allow the ECL gate to drive the non-ECL gate directly.

2. The circuitry of claim 1 wherein said ECL gate includes first and second transistors each having a base, a collector, and an emitter said bases coupled to a differential signal, and said emitters coupled together.

3. The circuitry of claim 2 wherein said node is coupled to the collector of one of said transistors.

4. The circuitry of claim 3 wherein said voltage regulator circuitry generates a predetermined voltage on a regulated voltage node coupled to said node.

5. The circuitry of claim 4 wherein said predetermined voltage is controlled over a predetermined temperature range.

6. The circuitry of claim 4 wherein said regulated voltage node is coupled to said node through a load.

7. The circuitry of claim 6 wherein the emitters of said transistor are connected to a current source operable to conduct a predetermined current, such that when said one transistor is enabled, a known potential is generated across said resistor.

8. The circuitry of claim 7 wherein said generated voltage on said regulated voltage node equals the threshold voltage of the non-ECL gate plus one-half of said known potential.

9. The circuitry of claim 1 wherein said non-ECL gate comprises a TTL gate.

10. The circuitry of claim 1 wherein said voltage regulator comprises circuitry to generate a known voltage which is controlled over temperature.

11. A method of generating output signals from an ECL gate for input to a non-ECL gate comprising the steps of:
    generating a predetermined voltage reference;
    coupling said predetermined voltage reference to the ECL gate output such that an output voltage transition of the ECL gate will encompass the threshold voltage of the non-ECL gate to allow the ECL gate to drive the non-ECL gate directly.

12. The method of claim 11 wherein said generating step comprises the step of generating a temperature controlled voltage reference.

13. The method of claim 11 wherein said coupling step comprises the step of coupling the voltage reference to the collector of one of the transistors of the ECL gate.

14. The method of claim 13 wherein said coupling step comprises the step of coupling the voltage reference to the collector of said one transistor through a resistor, such that a known potential will be generated when said one transistor is enabled.

15. The method of claim 14 wherein said step of generating a potential voltage comprises the step of generating a voltage equal to the threshold of the non-ECL gate plus one-half of the known potential.

16. An ECL gate operable to output TTL-level logic signals, comprising:
    first and second transistors, each having a base, a collector and an emitter, the emitters of said transistors coupled together;
    a resistor having a first terminal coupled to the collector of the first transistor;
    a voltage source connected to a second terminal of said resistor such that a logic transition of the ECL gate is operable to generate a TTL-level logic transition at said first terminal.

17. The ECL gate of claim 16 wherein said voltage source generates a voltage at said first terminal such that the voltage serving at said first terminal responsive to a logic transition of the ECL gate centered about the threshold voltage of a TTL-gate.

18. The ECL gate of claim 17 wherein said voltage source generates a voltage of $2 V_{be} + IR/2$, where $V_{be}$ equals the base-emitter voltage of a bipolar transistor and IR equals the potential across said resistor when said first transistor is enabled.

19. Circuitry for translating signals from a first circuit responsive to a first set of logic levels to a second circuit responsive to a second set of logic levels comprising:
    an output node comprising the output of said first circuit; and
    regulator circuitry coupled to said output node for regulating the voltage of the output node to generate output signals compatible with the second set of logic levels.

20. The circuitry of claim 19 wherein said first set of logic levels comprise ECL logic levels.

21. The circuitry of claim 19 wherein said second set of logic levels comprise TTL logic levels.

22. The circuitry of claim 19 wherein said second set of logic levels may be defined by a threshold voltage above which a signal is defined as a first logic state and below which a signal is defined as a second logic state.

23. The circuitry of claim 22 wherein said regulator is operable to center a voltage swing corresponding to a transition between logic states of said first set about said threshold voltage.

24. A circuit for generating logic output signals from an ECL gate for driving the input of a non-ECL gate comprising:
    a node associated with the output of the ECL gate and the input to the non-ECL gate; and
    voltage regulator circuitry coupled for generating a temperature controlled voltage to regulate the voltage on said node over a predetermined temperature range such that a voltage transition at said node responsive to a transition of the ECL gate encompasses the threshold voltage of the non-ECL gate.

25. A method of generating output signals from an ECL gate for input to a non-ECL gate comprising the steps of:
    generating a temperature controlled predetermined voltage reference; and
    coupling said temperature controlled predetermined voltage reference to the ECL gate output such that an output voltage transition of the ECL gate will encompass the threshold voltage of the non-ECL gate.

26. An ECL gate operable to output TTL-level logic signals, comprising:

first and second transistors, each having a base, a collector and an emitter, the emitters of said transistors coupled together;

a resistor having a first terminal coupled to the collector of the first transistor; and a voltage source operable to generate a voltage of $2V_{be}+IR/2$, where $V_{be}$ equals the base-emitter voltage of a bipolar transistor and IR equals the potential across said resistor when said first transistor is enabled, connected to a second terminal of said resistor such that a logic transition of the ECL gate is operable to generate a TTL-level logic transition at said first terminal.

* * * * *